(12) United States Patent
Endou et al.

(10) Patent No.: US 7,078,329 B2
(45) Date of Patent: Jul. 18, 2006

(54) METHOD OF MANUFACTURING SILICON CARBIDE SEMICONDUCTOR DEVICE

(75) Inventors: Takeshi Endou, Obu (JP); Yuuichi Takeuchi, Obu (JP)

(73) Assignee: Denso Corporation, Kariya (JP)

( * ) Notice: Subject to any disclaimer, the term of this patent is extended or adjusted under 35 U.S.C. 154(b) by 15 days.

(21) Appl. No.: 10/824,497

(22) Filed: Apr. 15, 2004

(65) Prior Publication Data

US 2004/0214453 A1    Oct. 28, 2004

(30) Foreign Application Priority Data

Apr. 23, 2003  (JP) ............................. 2003-118490

(51) Int. Cl.
  *H01L 21/283* (2006.01)
  *H01L 31/0312* (2006.01)
(52) U.S. Cl. ................... 438/602; 438/796; 438/931; 257/77; 257/E31.046
(58) Field of Classification Search ............... 438/602, 438/796, 931; 257/77
  See application file for complete search history.

(56) References Cited

U.S. PATENT DOCUMENTS 5,442,200 A * 8/1995 Tischler ................. 257/77
6,020,248 A * 2/2000 Zenke .................... 438/398
6,110,813 A * 8/2000 Ota et al. ................ 438/597
6,833,562 B1 * 12/2004 Tanimoto et al. ........... 257/77
2005/0205941 A1 * 9/2005 Tanimoto ................ 257/378

FOREIGN PATENT DOCUMENTS

| JP | A-10-125620 | 5/1998 |
| JP | A-2000-12846 | 1/2000 |
| JP | 2003-243654 | * 8/2003 |
| WO | WO 01/84609 | 11/2001 |

* cited by examiner

Primary Examiner—Zandra V. Smith
Assistant Examiner—Pamela E Perkins
(74) Attorney, Agent, or Firm—Posz Law Group, PLC

(57) ABSTRACT

An insulating film (2) is formed on a semiconductor substrate (1) formed of silicon carbide. A contact hole (3) is formed in the insulating film (2) to expose a part of the upper surface of the semiconductor substrate (1). Then, nickel (Ni) (4') is formed above the semiconductor substrate (1). Subsequently, the semiconductor substrate (1) is subjected to a heat treatment, whereby the contact portion of nickel (4') chemically bonds with the semiconductor substrate (1) to become an alloy layer (4) of silicon carbide and nickel. Nickel (4') on the insulating film (2) is selectively removed by etching liquid for dissolving the nickel.

8 Claims, 5 Drawing Sheets

METHOD OF MANUFACTURING SILICON CARBIDE SEMICONDUCTOR DEVICE

CROSS REFERENCE TO RELATED APPLICATION

This application is based upon, claims the benefit of priority of, and incorporates by reference the contents of Japanese Patent Application No. 2003-118490 filed on Apr. 23, 2003.

FIELD OF THE INVENTION

The present invention relates to a method of manufacturing a silicon carbide semiconductor device.

BACKGROUND OF THE INVENTION

Silicon carbide has excellent voltage withstanding characteristics in comparison with silicon single body. Therefore, it has been proposed that large power consumption semiconductor devices such as a power transistor be implemented by a silicon carbide semiconductor device using a semiconductor substrate formed of silicon carbide.

Furthermore, it has been proposed for such a silicon carbide semiconductor device that the electrode formed on a surface of a semiconductor substrate of silicon carbide be formed of nickel (Ni). The nickel can form an ohmic contact with the surface of the semiconductor substrate formed of silicon carbide while reducing the resistance of the contact portion.

However, when oxide film is formed on the semiconductor substrate of silicon carbide and a contact hole is formed in the oxide film and the contact hole is filled with nickel, nickel thin film is also formed on the upper surface of the oxide film. The nickel thin film formed on the oxide film frequently becomes peeled off, which lowers the reliability of the silicon carbide semiconductor device.

Therefore, it has been proposed in JP-A-10-125620 (hereafter patent document 1) that the nickel thin film on the oxide film be etched by a lithography technique. However, because the mask may be formed in an erroneous location, it is difficult to properly leave the nickel thin film at only the contact hole portion. More fully, if over-etching is performed subsequent to the lithography step, the nickel thin film in the contact hole is etched, so that the contact area is reduced and the contact resistance is increased. Further, when under-etching is carried out, nickel remains on the oxide film.

Therefore, it has been proposed in JP-A-2000-12846 (hereafter Patent Document 2) that the silicon carbide and nickel be chemically combined with each other in self-alignment at the contact portion with the surface of the semiconductor substrate by a heat treatment after the nickel thin film is formed. Using this heat treatment eliminates the problems associated with the lithography technique disclosed in Patent Document 1 and discussed above. However, as indicated in Patent Document 2, the heat treatment results in the problem of the nickel thin film becoming particles in a subsequent step. Further, it has been confirmed by the inventors that when the nickel thin film at the contact hole is chemically combined with the semiconductor substrate of silicon carbide by the heat treatment and the nickel thin film which is not chemically combined with silicon carbide is then removed by ultrasonic cleaning, the nickel thin film remains on the oxide film.

The contents of JP-A-10-125620 and JP-A-2000-12846 are incorporated herein by reference.

SUMMARY OF THE INVENTION

It is an object of the present invention to provide a method of manufacturing a silicon carbide semiconductor device which can more properly form an electrode in a contact hole. Accordingly, in a method for forming a silicon carbide semiconductor device, a metal film containing nickel is formed above the semiconductor substrate in which a contact hole was formed; the metal film formed in the contact hole in the metal film is chemically combined with the surface of the semiconductor substrate below the contact hole by subjecting the semiconductor substrate to a heat treatment; and the metal film formed on the insulating film is removed with etching liquid for dissolving the metal.

According to this method, after the metal in the contact hole and the surface of the semiconductor substrate below the contact hole are chemically combined with each other, the metal on the insulating film is removed by the etching liquid for dissolving the metal. At this time, the metal in the contact hole is not dissolved because it is chemically combined with silicon carbide. Accordingly, the electrode can be formed in self-alignment and more properly formed in the contact hole.

Nickel single body may be used as the metal so as to achieve the silicon carbide semiconductor device manufacturing method, thereby the electrode formed at the contact hole portion can be easily formed with low resistance.

The etching liquid preferably includes a solution containing any one of sulfuric acid, phosphoric acid, nitric acid and acetic acid. Accordingly, the nickel single body can be easily removed by etching, and also the compound of nickel and silicon carbide can be suitably held.

The etching liquid may also include a mixture liquid of sulfuric acid and hydrogen peroxide solution. By using the mixture liquid of sulfuric acid and hydrogen peroxide solution as described above, the etching rate when nickel is removed by etching can be suitably secured.

The method may further include etching the upper surface of the insulating film after removing the metal film formed on the insulating film by etching liquid for dissolving the metal.

When the metal is subjected to a heat treatment, a compound with the metal is sometimes formed on the upper surface of the insulating material. By etching the upper surface of insulating film after removing the metal on the insulating film with etching liquid, the surface state of the insulting film can be regulated.

The metal film formed in the contact hole is preferably chemically combined with the surface of the semiconductor substrate below the contact hole by subjecting the semiconductor substrate to a heat treatment of 900° C. or more. Accordingly, the metal and the surface of the semiconductor substrate can be suitably chemically combined with each other.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

An embodiment of a silicon carbide semiconductor device manufacturing method according to the present invention will be described with reference to the drawings.

First, referring to FIGS. 1A–1C, formation of the electrode on a silicon carbide semiconductor generally according to a preferred methodology will be described.

Figure 1A:
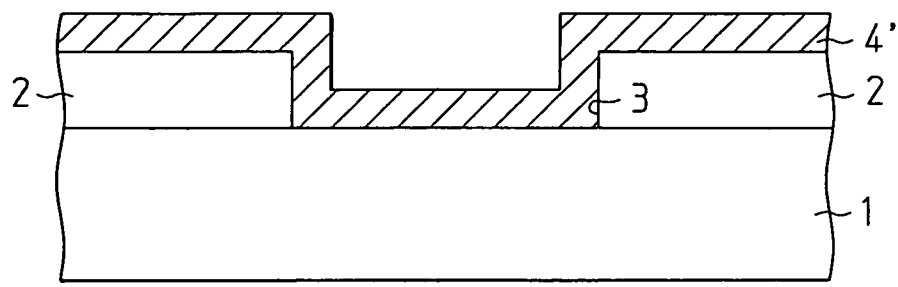
FIGS. 1A–1C are cross-sectional views illustrating a general case of formation of the electrode on a silicon carbide semiconductor according to a preferred methodology.

First, insulating film 2 is formed on a semiconductor substrate 1 formed of silicon carbide as shown in FIG. 1A. Furthermore, a contact hole 3 is formed in the insulating film 2 to expose a part of the upper surface of the semiconductor substrate 1. Then, nickel (Ni) film 4' is formed above the semiconductor substrate 1.

Figure 1B:
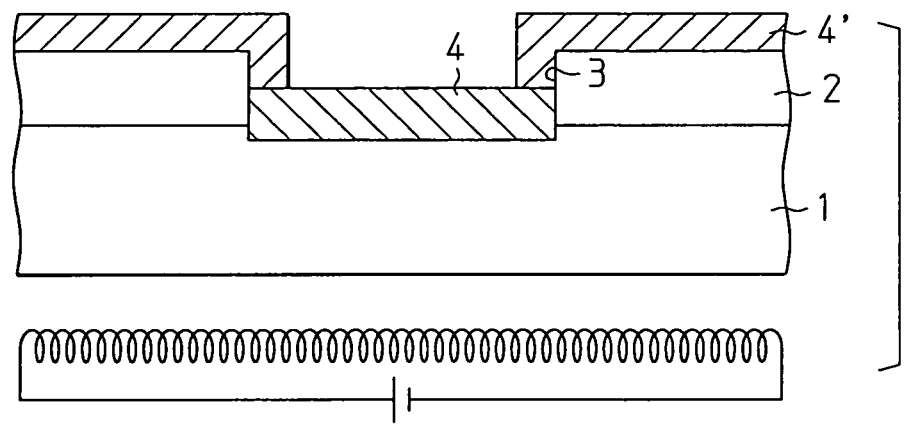

Subsequently, as shown in FIG. 1B, the semiconductor substrate 1 is subjected to a heat treatment. Accordingly, a portion of the nickel film 4' brought into contact with the semiconductor substrate 1 becomes an alloy layer 4 corresponding to the compound of silicon carbide and nickel.

Figure 1C:
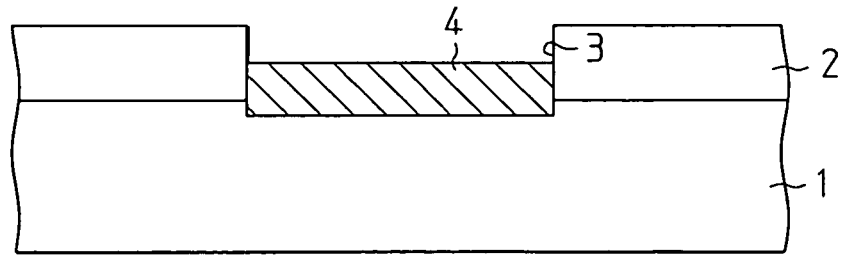

Furthermore, as shown in FIG. 1C, the nickel film 4' on the insulating film is selectively removed by etching liquid for dissolving the nickel. In this case, nickel on the semiconductor substrate 1 which is exposed through the contact hole 3 is set to the alloy layer 4, and thus it is not dissolved by etching liquid.

As described above, the nickel film 4' formed at the portion other than the contact hole 3 is suitably removed. However, the alloy layer 4 in the contact hole 3 is not dissolved because it forms a compound with silicon carbide. Accordingly, an electrode can be more properly formed in the contact hole 3.

Figure 4A:
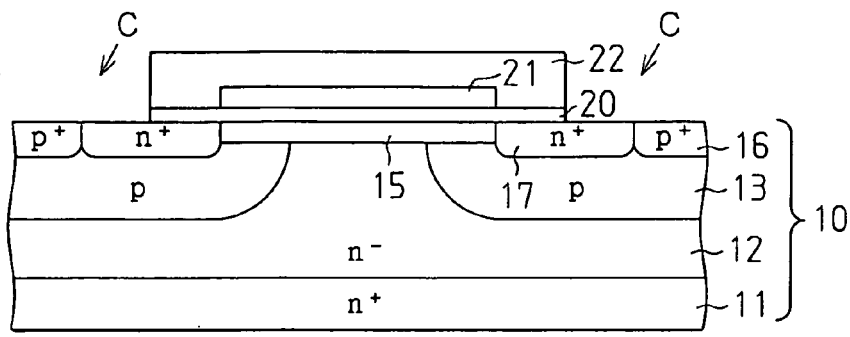
FIGS. 4A–4D are cross-sectional views illustrating formation of a silicon carbide semiconductor device according to a preferred methodology.
Figure 4B:
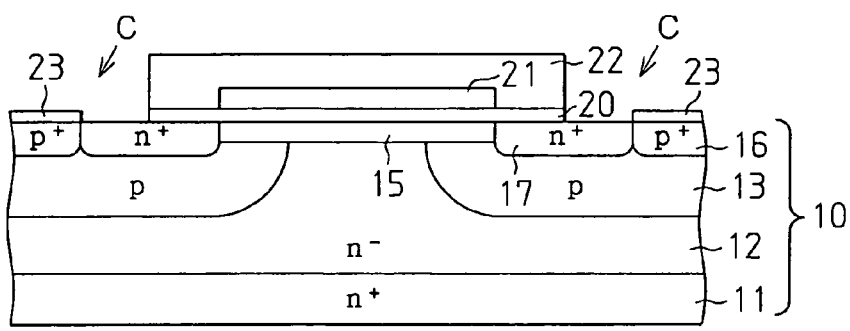
Figure 4C:
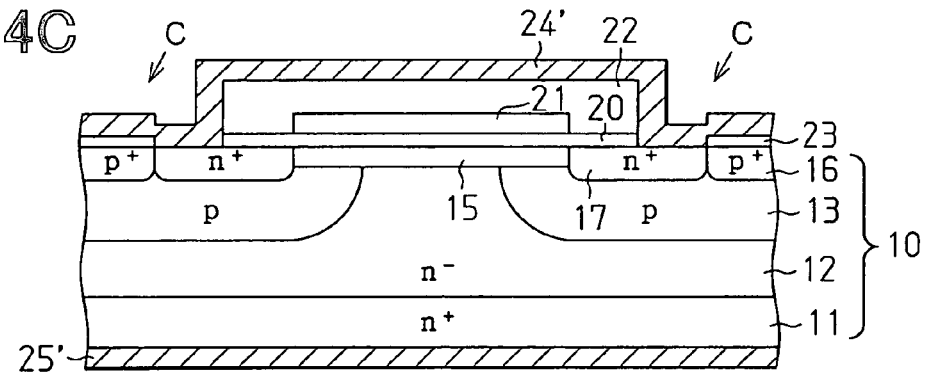
Figure 4D:
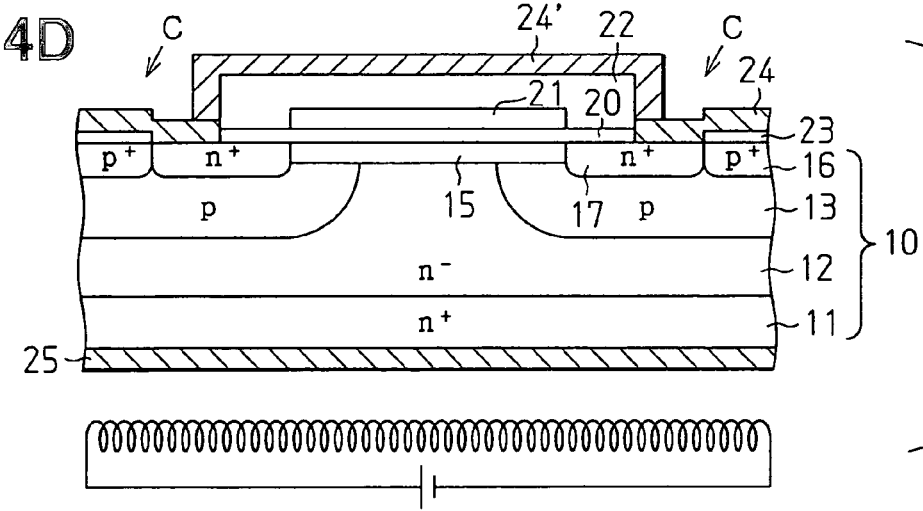
Figure 5A:
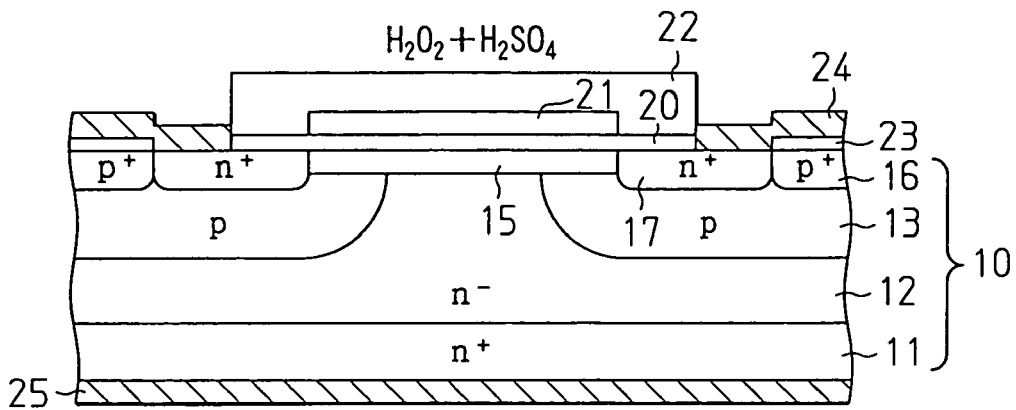
FIGS. 5A–5C are cross-sectional views illustrating formation of a silicon carbide semiconductor device according to a preferred methodology.
Figure 5B:
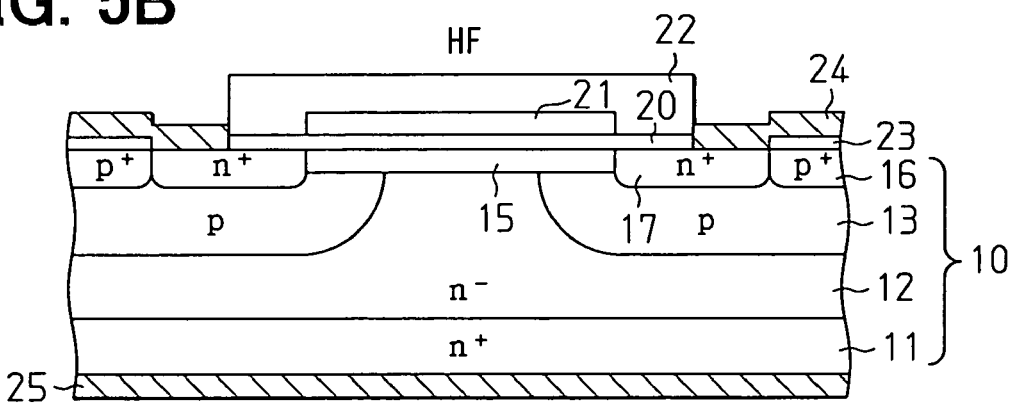
Figure 5C:
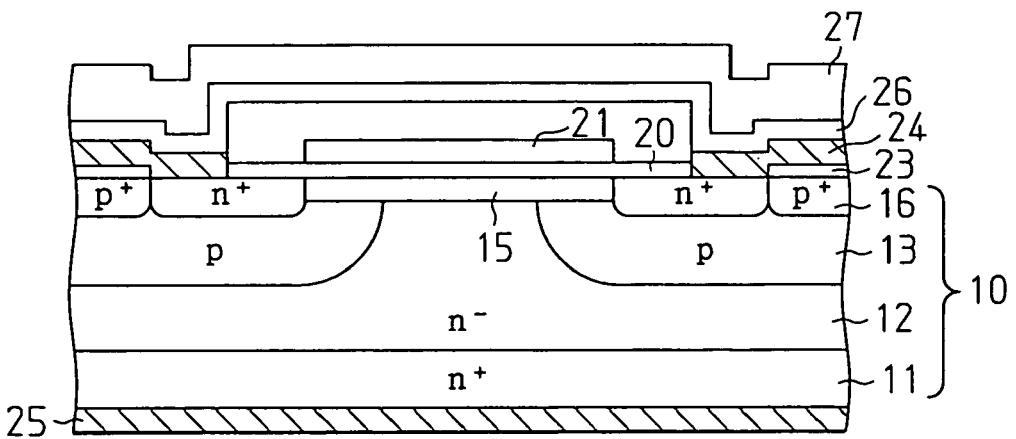

Referring to FIGS. 2A–5C, a silicon carbide semiconductor device manufactured according to a preferred methodology will be discussed. As shown in FIG. 5C, the silicon carbide semiconductor device is equipped with a planar type MOS (metal oxide semiconductor) transistor. The silicon carbide semiconductor device may be applied to an inverter or a rectifier of an alternator for a vehicle.

Figure 2A:
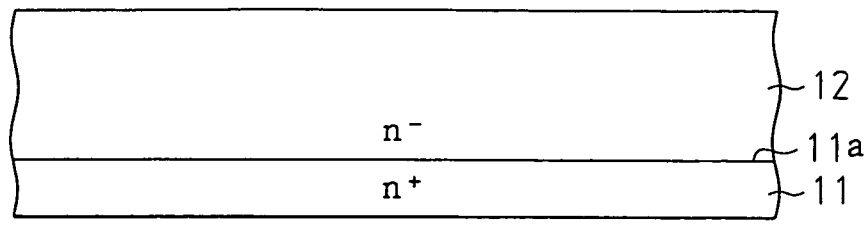
FIGS. 2A–2D are cross-sectional views illustrating formation of a silicon carbide semiconductor device according to a preferred methodology.

First, as shown in FIG. 2A, a substrate comprising an $n^+$-type silicon carbide substrate 11 and an $n^-$-type drift layer 12 is prepared. Here, the $n^+$-type silicon carbide substrate 11 has an n-type conduction type and is comprised of 4H—SiC, 6H—SiC or 3C—SiC. The $n^+$-type silicon carbide substrate 11 has a thickness of "400 µm", for example, and the principal surface 11a thereof is (0001)Si-face or (1120)A-face. The $n^-$-type drift layer 12 is formed on the $n^+$-type silicon carbide substrate 11 (principal surface 11a) to have a thickness of "5 µm" by epitaxial growth. The $n^-$-type drift layer 12 has the same crystal structure (4H—SiC, 6H—SiC or 3C—SiC) as the $n^+$-type silicon carbide substrate 11 serving as a base substrate, and has an n-type conduction type.

Figure 2B:
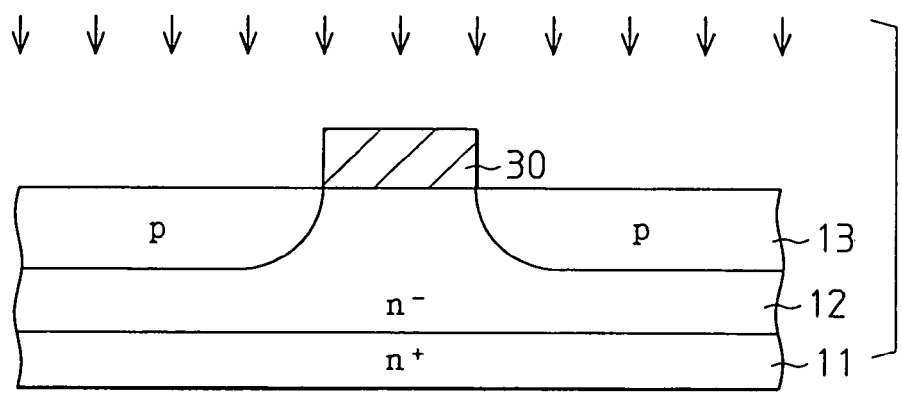

As shown in FIG. 2B, a mask 30 comprising LTO (low temperature oxide) is patterned at a predetermined area on the $n^-$-type drift layer 12, and aluminum (Al) is doped by ion implantation to thereby form a base region 13 having a p-type conduction type at the surface layer portion of the $n^-$-type drift layer 12. The ion implantation condition at this time is set to "700° C." in temperature and "$1 \times 10^{16}$ cm$^{-2}$" in dose amount.

Figure 2C:
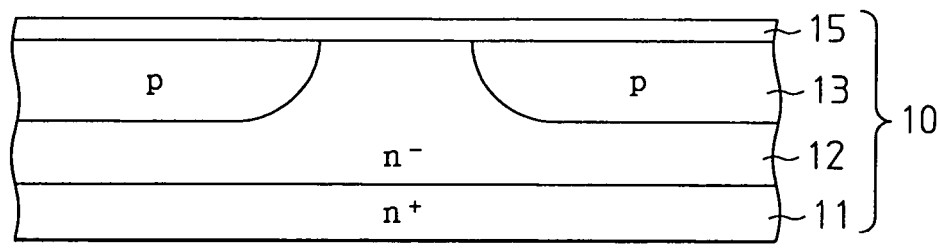

Furthermore, after the mask 30 is removed, an n-type channel layer 15 is epitaxially grown on the $n^-$-type drift layer 12 and the base region 13 as shown in FIG. 2C. The growth condition at this time is set to $SiH_4$, $C_3H_8$, $H_2$ as source gas and a growth temperature of "1600°". The channel layer 15 has the same crystal structure (4H—SiC, 6H—SiC or 3C—SiC) as the $n^-$-type drift layer 12.

Figure 2D:
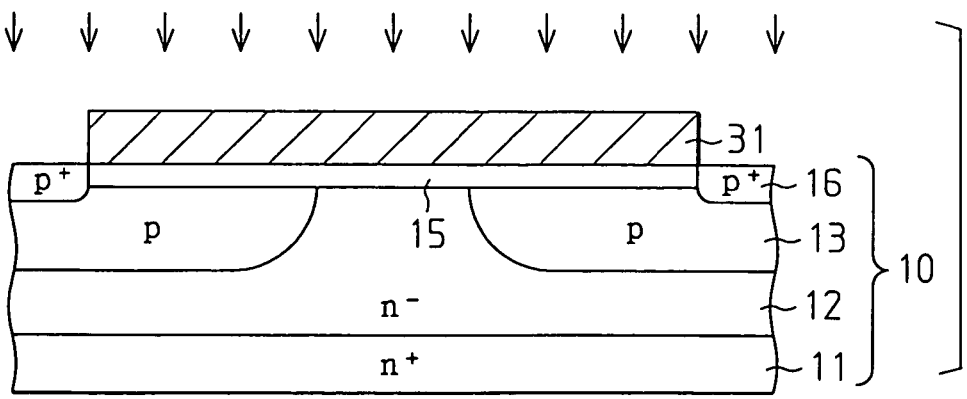

When the semiconductor substrate 10 having the $n^+$-type silicon carbide substrate 11, the $n^-$-type drift layer 12 and the channel layer 15 is formed, LTO film is formed on the semiconductor substrate 10 and then patterned to form the mask 31 as shown in FIG. 2D. Further, aluminum (Al) is doped from the upper side of the mask 31 by ion implantation to form a $p^+$ contact area 16 at the end portion of each transistor on the surface of the semiconductor substrate 10.

Figure 3A:
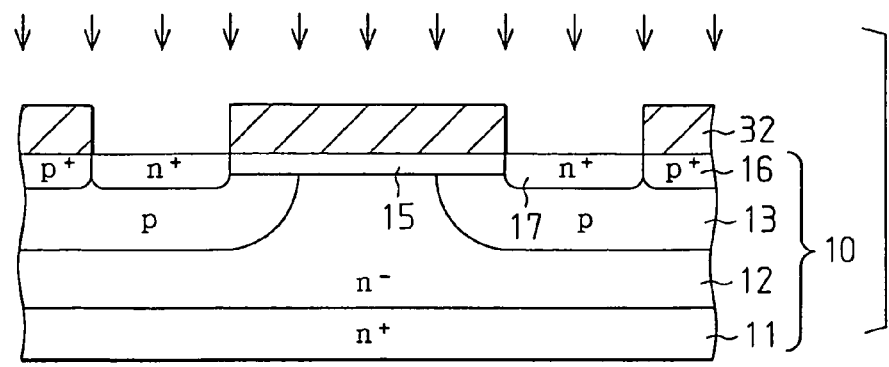
FIGS. 3A–3D are cross-sectional views illustrating formation of a silicon carbide semiconductor device according to a preferred methodology.
Figure 3B:
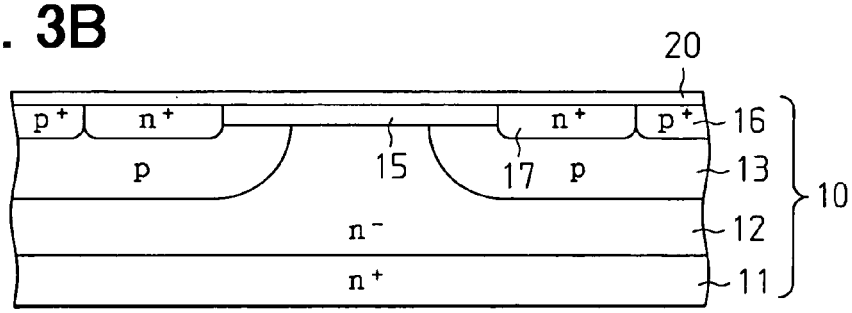

Subsequently, as shown in FIG. 3A, a mask 32 formed of LTO is formed so as to be opened at the positions corresponding to the areas adjacent to the $p^+$ contact area 16 in the semiconductor substrate 10 as shown in FIG. 3A. Then, nitrogen (N) is doped from the upper side of the mask 32 by ion implantation to form an $n^+$-type source region 17 at the surface layer portion of the base region 13. The ion implantation condition at this time is set to "700° C." in temperature and "$1 \times 10^{16}$ cm$^{-2}$" in dose amount, for example.

After the mask 32 is removed, the upper surface of the semiconductor substrate 10 is subjected to a thermal oxidation treatment to form gate insulating film 20. At this time, the environmental temperature is set to "1080° C.", for example.

Figure 3C:
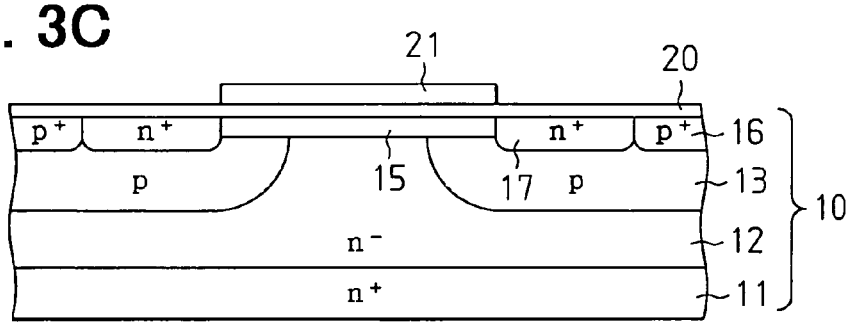
Figure 3D:
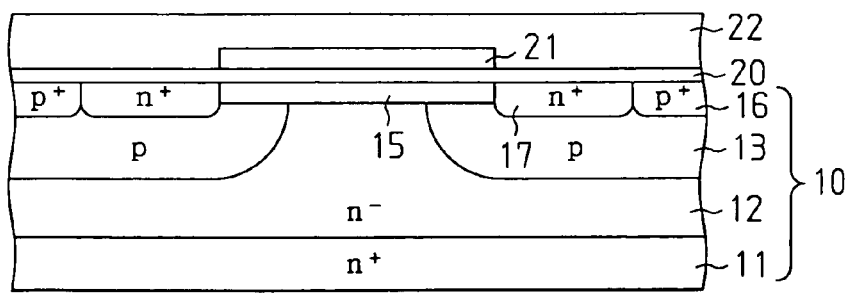

Thereafter, as shown in FIG. 3C, a gate electrode 21 formed of polysilicon having a p-type conduction type is formed on the gate insulating film 20. Subsequently, as shown in FIG. 3D, interlayer insulating film 22 formed of LTO is coated on the gate electrode 21 and the gate insulating film 20.

Subsequently, as shown in FIG. 4A, the interlayer insulating film 22 and the gate insulating film 20 are opened to form contact holes C by using the lithography technique to come into contact with the $p^+$ contact area 16 and $n^+$-type source region 17.

Furthermore, as shown in FIG. 4B, aluminum thin film 23 of, for example, "100 nm" in thickness is formed on the $p^+$ contact area 16 of the surface of the semiconductor substrate 10 exposed by the contact holes C. The aluminum thin film 23 may be formed according to Patent Document 2.

Subsequently, as shown in FIG. 4C, nickel thin film 24' and nickel thin film 25' are formed on the surface of the semiconductor substrate 10 and the back surface of the semiconductor substrate 10 respectively to have a thickness of "500 nm", for example.

Furthermore, as shown in FIG. 4D, an anneal treatment is carried out on the semiconductor substrate 10 at a predetermined temperature (for example, "1000° C.") for a predetermined time (for example, "10 minutes"). With this treatment, the nickel thin film 25' on the back surface of the semiconductor substrate 10 becomes an alloy layer 25 of nickel and SiC, and the nickel thin film 24' at the portion exposed by the contact hole C on the surface of the semiconductor substrate 10 becomes an alloy layer 24 of nickel and SiC. However, the upper portion of the alloy layer 24 above the aluminum thin film 23 is formed of alloy of nickel, SiC and aluminum. In this case, the nickel thin film 24' on the interlayer insulating film 22 remains nickel single body.

As shown in FIG. 5A, the upper surface of the semiconductor substrate 10 is immersed in solution which is composed of sulfuric acid and hydrogen peroxide solution and kept at a predetermined temperature (for example, "120° C."), thereby dissolving the nickel thin film 24' on the interlayer insulating film 22. The solution may have a 4:1 ratio of sulfuric acid and hydrogen peroxide solution. At this time, the alloy layer 24 in the contact hole C is not dissolved in the solution.

Subsequently, as shown in FIG. 5B, the surface of the semiconductor substrate 10 is immersed in hydrofluoric acid solution having a concentration of, for example "1%" for a predetermined time (for example, "one minute") to etch the surface of the interlayer insulating film 22. This treatment is carried out to deal with the case where the upper surface of the interlayer insulating film 22 and the nickel thin film 24' slightly react with each other or the like, whereby the state of the surface of the interlayer insulating film 22 is regulated.

Subsequently, the interlayer insulating film 22 is opened at a predetermined area to establish electrical contact with the gate electrode 21. Furthermore, as shown in FIG. 5C, metal film 26 of titanium (Ti) or the like which will serve as a source electrode and has high adhesiveness to the alloy layer 24, and aluminum thin film 27 for wire are successively laminated to form a planar type MOS transistor.

According to the methodology described above, the following effects can be achieved.

(1) The nickel thin film 24' in the contact holes C and the surface of the semiconductor substrate 10 are chemically combined with each other, and then the nickel thin film 24' is dissolved with the solution containing sulfuric acid and hydrogen peroxide solution, whereby the nickel thin film 24' formed at the portions other than the contact holes C can be removed in self-alignment.

(2) The etching rate when the nickel thin film 24' is removed by etching can be properly secured by using the mixture liquid of sulfuric acid and hydrogen peroxide solution.

(3) The surface state of the interlayer insulating film 22 can be regulated by immersing the upper surface of the interlayer insulating film 22 in hydrofluoric acid to etch the upper surface.

The above-described embodiment may be modified as follows.

The etching liquid for dissolving nickel is not limited to the solution of sulfuric acid and hydrogen peroxide solution. For example, it may be a solution containing any one of sulfuric acid, phosphoric acid, nitric acid and acetic acid.

The temperature of the heat treatment when the nickel thin film 24' in the contact holes C and the surface of the semiconductor substrate 10 are chemically combined with each other is not limited to that of the above-described embodiment. However, it is preferably set to "900° C." or more. By setting the temperature to "900° C." or more as described above, the nickel thin film 24' can be diffused on the surface of the semiconductor substrate 10. Accordingly, sufficient ohmic contact can be established between the nickel thin film 24' (alloy layer 24) and the semiconductor substrate 10.

The material of the electrode formed in the contact hole is not limited to nickel single body, and it may be metal containing nickel. Even in this case, the same effect as in the above-described (1) can be achieved by chemically combining metal containing nickel and the surface of the semiconductor substrate exposed through the contact hole and then using the etching liquid which dissolves the metal, but does not dissolve the compound.

When the state of the interlayer insulating film after metal or nickel single body on the interlayer insulating film is dissolved by the etching liquid is excellent, etching the surface thereof with hydrofluoric acid is not necessary.

The etching liquid for etching the upper surface of the interlayer insulating film is not limited to hydrofluoric acid.

The silicon carbide semiconductor device is not limited to the construction of the above-described embodiment, and it may be properly modified insofar as an electrode can be formed in a contact hole through which insulating film on a semiconductor substrate of silicon carbide is opened.

The description of the invention is merely exemplary in nature and, thus, variations that do not depart from the gist of the invention are intended to be within the scope of the invention. Such variations are not to be regarded as a departure from the spirit and scope of the invention.

The invention claimed is:

1. A method of manufacturing a silicon carbide semiconductor in which an electrode is formed in a contact hole in an insulating film on a semiconductor substrate formed from a silicon carbide, the method comprising:

forming a metal film in the contact hole and on the insulating film of the semiconductor substrate;

chemically combining the metal film formed in the contact hole with a surface of the semiconductor substrate below the contact hole by subjecting the semiconductor substrate to a heat treatment to form an alloy film of silicon carbide an the metal film at the contact hole; and removing the metal film formed on the insulating film with an etching liquid for dissolving the metal.

2. The method according to claim 1, wherein the forming of the metal film further comprises forming the metal film to be comprised of a nickel single body.

3. The method according to claim 2, wherein the etching liquid comprises any one of sulfuric acid, phosphoric acid, nitric acid and acetic acid.

4. The method according to claim 2, wherein the etching liquid comprises a mixture liquid of sulfuric acid and hydrogen peroxide solution.

5. The method according to claim 1, further comprising etching an upper surface of the insulating film after the removing of the metal film formed on the insulating film with etching liquid for dissolving the metal.

6. The method according to claim 5, wherein the chemically combining of the metal film formed in the contact hole with the surface of the semiconductor substrate comprises subjecting the semiconductor substrate to a heat treatment of 900° C. or more.

7. The method according to claim 1, wherein the chemically combining of the metal film formed in the contact hole with the surface of the semiconductor substrate comprises subjecting the semiconductor substrate to a heat treatment of 900° C. or more.

8. The method according to claim 1, wherein the removing the metal film formed on the insulating film with an etching liquid includes selectively etching the metal film formed on the insulating film.

* * * * *